(12) United States Patent
Visconti

(10) Patent No.: US 6,519,183 B2
(45) Date of Patent: Feb. 11, 2003

(54) METHOD AND A CIRCUIT STRUCTURE FOR MODIFYING THE THRESHOLD VOLTAGES OF NON-VOLATILE MEMORY CELLS

(75) Inventor: Angelo Visconti, Appiano Gentile (Como) (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/908,986

(22) Filed: Jul. 18, 2001

(65) Prior Publication Data

US 2002/0018368 A1 Feb. 14, 2002

(30) Foreign Application Priority Data

Jul. 18, 2000 (EP) .......................................... 00 830 504

(51) Int. Cl.[7] ............................................... G11C 11/34
(52) U.S. Cl. ............................... 365/185.18; 365/185.22
(58) Field of Search ....................... 365/185.18, 185.22

(56) References Cited

U.S. PATENT DOCUMENTS

| 5,487,033 A | | 1/1996 | Keeney et al. ......... 365/185.19 |
| 5,751,635 A | * | 5/1998 | Wong et al. ........... 365/185.19 |
| 5,798,966 A | * | 8/1998 | Keeney ................. 365/185.18 |
| 5,912,845 A | | 6/1999 | Chen et al. .............. 365/185.3 |
| 6,040,996 A | | 3/2000 | Kong ..................... 365/185.19 |

FOREIGN PATENT DOCUMENTS

| EP | 0690451 A2 | | 1/1996 | |
| EP | 0833348 A1 | | 4/1998 | |
| JP | 0032495 | * | 2/1989 | ........... G11C/17/00 |

OTHER PUBLICATIONS

Betty Prince, "Semiconductor Memories", 1983, Wiley, 2nd edition, pp. 641–643.*

* cited by examiner

Primary Examiner—M. Tran
(74) Attorney, Agent, or Firm—Lisa K. Jorgenson; Robert Iannucci; Seed IP Law Group PLLC

(57) ABSTRACT

A method of modifying the threshold voltages of a plurality of non-volatile memory cells, for example, flash EEPROM memory cells, after an erasure operation, is described. In order to perform the equalization quickly and to optimize the use of the voltage supplies for biasing the columns, the method provides for the following steps: connecting all of the column lines to a voltage supply, monitoring the supply voltage, and applying, to all of the row lines, a voltage variable from a predetermined minimum value to a predetermined maximum value, the rate of change being regulated to maintain the supply voltage of the column lines at a substantially constant, predetermined value. The same method can be used for reliable and quick programming of a memory of the flash EEPROM type, or of another type.

26 Claims, 3 Drawing Sheets

METHOD AND A CIRCUIT STRUCTURE FOR MODIFYING THE THRESHOLD VOLTAGES OF NON-VOLATILE MEMORY CELLS

FIELD OF THE INVENTION

The present invention relates to non-volatile semiconductor memories and, more particularly, to a method and to a circuit structure for modifying the threshold voltages of the cells of a memory.

BACKGROUND OF THE INVENTION

A typical EEPROM memory is formed on a substrate of semiconductor material as a matrix of memory cells, each constituted by a body region with p-type conductivity in which two (source and drain) regions with n-type conductivity are formed, separated by a channel region. A floating-gate electrode is disposed above the channel region and is insulated therefrom by a thin layer of dielectric material. A control gate electrode extends above the floating gate electrode and is insulated therefrom by another layer of dielectric material.

The cells of the matrix have their source regions connected together to a common terminal which, during programming and reading, is generally connected to the negative (ground) terminal of the supply of the integrated circuit of which the memory forms part. The drain regions of the cells of each column of the matrix are connected to one another by common connection lines, known as bit lines or column lines. The control gate electrodes of the cells of each line are connected to one another by common connection lines known as word lines or row lines. A memory structure of this type is known as a NOR-matrix memory.

Each cell of the matrix can be selected by a row decoder and a column decoder. Once selected, the cell can be polarized by the application of suitable potentials to its terminals and its state can be investigated by means of a sense amplifier connected in series with the respective bit line.

In order to write or program a cell of the memory, the bit line and the word line which identify it are brought to predetermined potentials higher than the common source potential, for example 5V and 9V, respectively, such as to bring about a flow of "hot electrons" through the thin dielectric layer from the substrate to the floating-gate electrode. The electrons which accumulate in the floating-gate electrode bring about an increase (of 2–4V) in the threshold voltage of the cell.

In order to read a cell, the common source terminal is connected to ground, the bit line (drain) is brought to a positive potential, the word line (control gate) is brought to a positive potential higher than that of the bit line, and the drain current is measured by the sense amplifier. A non-programmed cell (logic level "1") conducts a relatively high current (for example 50 µA) whereas a programmed cell (logic level "0") conducts a considerably lower current.

In order to erase a cell, a positive potential (for example, 5V) is applied to the common source terminal, a negative potential (for example, –8V) is applied to the word line (control gate), and the bit line (drain) is left floating. In these conditions, a strong electric field is developed between the floating-gate electrode and the source region so that the negative charge formed by the accumulated electrons is extracted from the floating-gate electrode by the tunnel effect. In a flash EEPROM memory, erasure takes place simultaneously for all of the cells of the matrix or for the cells of a selected section of the matrix.

More particularly, in order to perform the erasure, a series of voltage pulses is applied to the cells so as to extract electrons from the floating gate by the tunnel effect. An operation is generally performed after each pulse to check the state of each individual cell in order to see whether it has reached the "1" state, that is, the erased cell state. In practice, the cell is biased for reading and its drain current is measured. If the current measured is below a predetermined value, which indicates that the conduction threshold has not been reached, a further erasure pulse is applied. These operations are repeated until the cell with the highest threshold within the matrix is recognized as an erased cell.

Since the operation to erase a flash EEPROM memory is not selective, the cells which have already been recognized as erased continue to be subjected to erasure pulses. Since each erasure pulse involves the removal of electrons from the floating gate, the thresholds of these cells will continue to be lowered upon each pulse. When all of the cells have been recognized as erased, some of them will therefore have very low or even negative threshold voltages, and will thus behave as depletion transistors. A typical distribution of threshold voltages Vth of the cells after erasure is shown in FIG. 1 in which D.V. and E.V. indicate two predetermined voltage values, as will be explained below, and Log # indicates the logarithm of the number of cells of the memory or of the section in question.

Cells with thresholds below a certain value are the cause of potential reading errors. In fact, it should be borne in mind that, in order to read a cell, positive voltages are applied both to the column and to the row which contain the cell, and the remaining rows are connected to ground. If the column line selected contains a cell which has been erased excessively until it has a threshold below zero, when the respective row line is grounded, the cell will have its gate electrode at zero and will therefore be conductive, thus potentially causing a false reading.

The excessively erased cells also cause leakage currents during programming. In fact, for programming, positive voltages are also applied to a selected column and a selected row whilst the non-selected rows are connected to ground. An excessively erased cell in the selected column is also conductive when the respective row is not selected so that, in the selected column, there will therefore be a spurious current which may overload the supply of the column lines.

To prevent the problems described above, the threshold of each erased cell must be below a maximum value generally known as the erase verify point, indicated E.V. in FIG. 1, but above a minimum value, generally referred to as the depletion verify point, indicated D.V. in FIG. 1. In other words, the condition that the threshold values of the erased cells of the memory should all be within a "range" of values delimited by the two verify points must be satisfied.

With the tendency to design integrated circuits, and particularly memories, with ever lower supply voltages, the erase verify point falls to very low values. Moreover, since the precise breadth of the distribution of the threshold values of the cells upon completion of the erasure operation is difficult to predict and may in any case undergo variations during the life of the device (because of the variability of the parameters of the manufacturing process, of the erasure method selected, of the ageing state, that is, of the number of programming-erasure cycles to which the memory has been subjected, and of occasional anomalies in the conduction characteristics of the tunnel dielectrics), the condition indicated above is ever more difficult to satisfy.

In order to bring the thresholds of the erased cells within the "range" of values delimited by the two verify points, a known method provides for "soft" programming operations after the erasure of the cells. In practice, the cells whose thresholds are below the depletion verify point are identified and are subjected to a programming operation, for example, by the application of voltage pulses of increasing amplitude to their gate electrodes, followed by a verification operation each time, until a threshold above the depletion verify point is recognized. Upon completion of the "soft" programming operations, the distribution of threshold voltages should be as shown in FIG. 2.

The soft programming is performed automatically after an erasure operation by suitable control circuits. To ensure a high level of reliability of the devices, these circuits have to be designed so as to take into account process variability, the conditions of use of the device, and its ageing, so that the initial voltage selected for the corrective programming pulses is very low and the rate of increase of the pulses is prudently low. The time required for the correction operation is therefore quite long. During the design of the device, it is also necessary to take into account the most unfavorable conditions which may arise with regard to the supply, and it is therefore necessary for the voltage supplies, particularly those which supply the column lines, to have dimensions capable of handling the maximum load which can be expected. This generally involves making the voltage supplies, which are normally charge pumps, larger than is necessary for the average supply requirements. Finally, the identification of the cells with thresholds below the depletion verify point may be neither easy nor reliable, particularly in the presence of high leakage currents.

SUMMARY OF THE INVENTION

According to principles of the present invention, a method and a circuit structure are provided for modifying the threshold voltages of the cells of a non-volatile memory quickly. Charge pumps and other related circuits are provided. Increased reliability of the device is achieved using the present invention.

Aspects of the method and circuit structure of the present invention include a first voltage supply connected to column lines of a plurality of memory cells and a second voltage supply connected to row lines of the plurality of memory cells, the voltage supplies being connected through a feedback path. The output voltage of the first voltage supply is monitored by a sensing circuit, which in turn supplies a signal through the feedback path to an input of the second voltage supply. In one embodiment of the invention, the second voltage supply may be comprised of a variable voltage generator whose output voltage depends on the signal received from the sensing circuit. The method and circuit structure of the present invention provide a means for modifying quickly the threshold voltages of memory cells, such as after an erasure operation or during a programming operation, without excessively loading the first voltage supply or causing the output of the first voltage supply to drop below a predetermined value.

BRIEF DESCRIPTION OF THE DRAWINGS

The invention will be understood better from the following detailed description of a non-limiting embodiment thereof, given with reference to the appended drawings, in which.

DETAILED DESCRIPTION OF THE INVENTION

Figure 1:
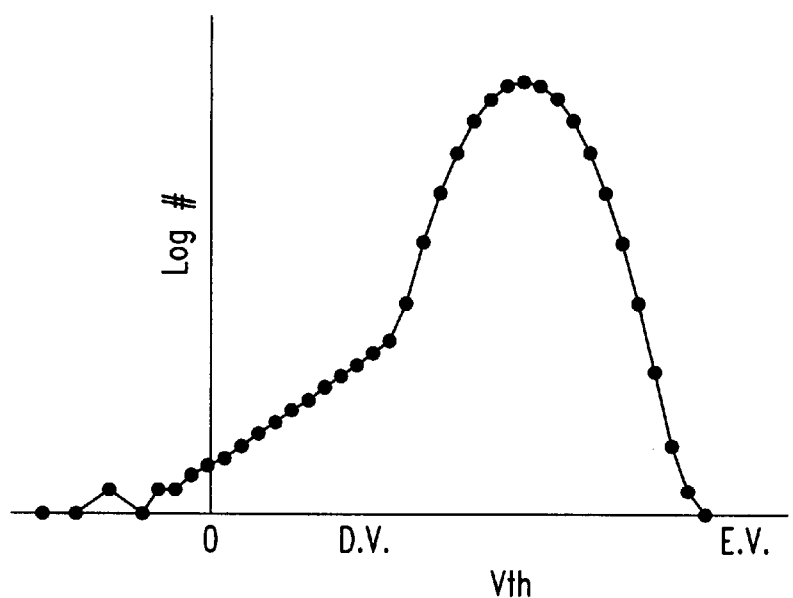
FIGS. 1 and 2 show two distributions of threshold voltages of the cells of a flash EEPROM memory immediately after erasure and after "soft" programming, respectively.
Figure 2:
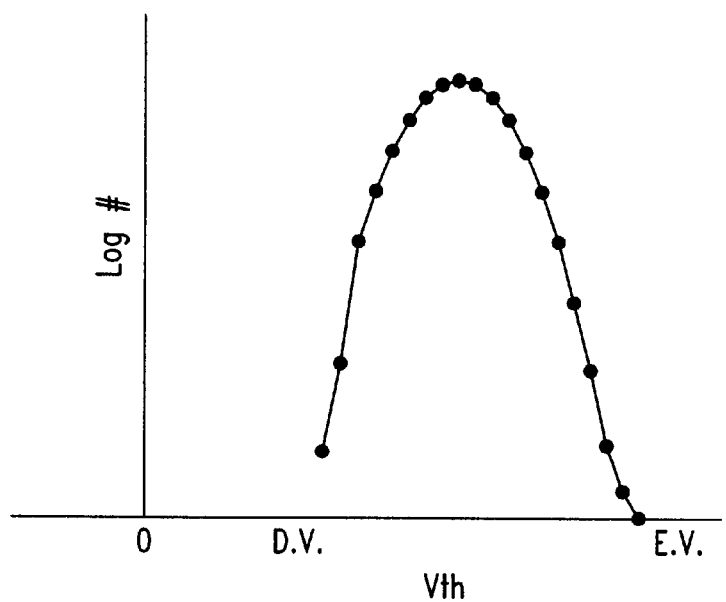
Figure 3A:
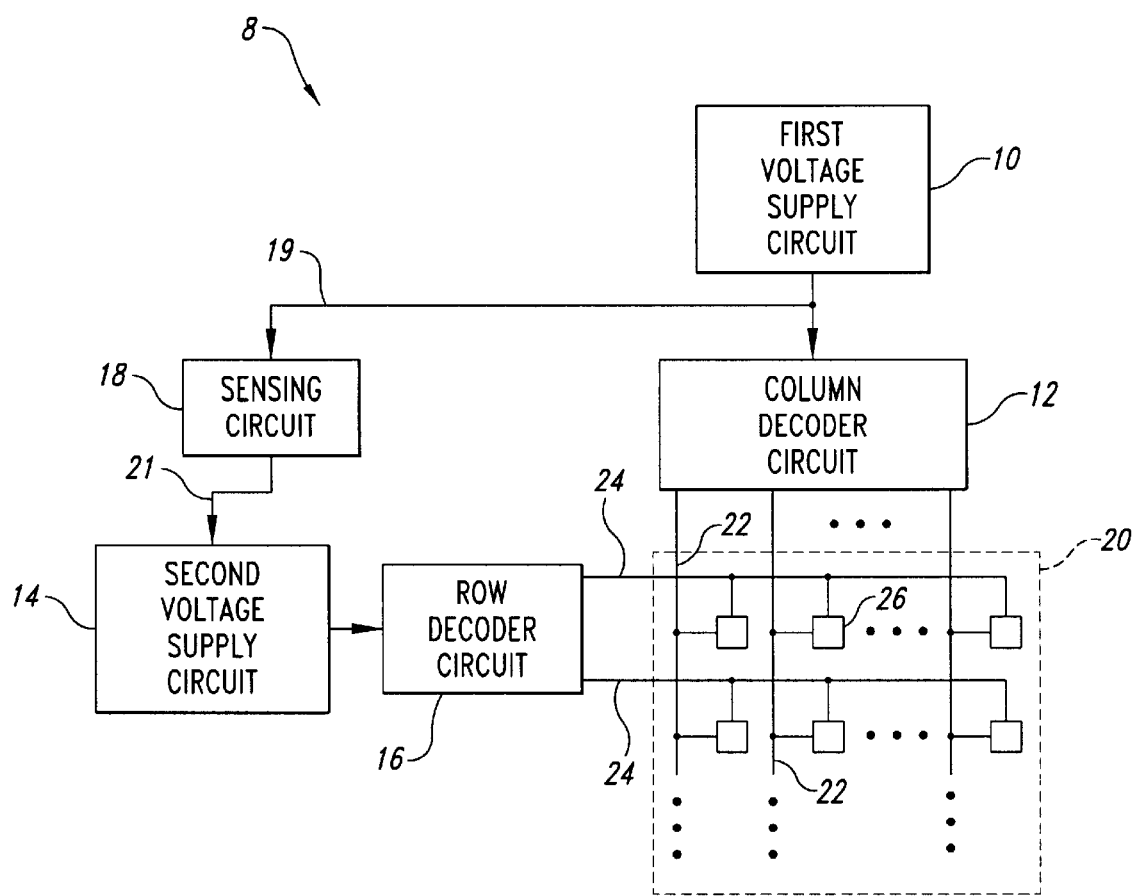
FIG. 3A is a block diagram of a circuit structure according to the invention.

FIG. 3A illustrates a general block diagram of a memory circuit 8 according to principles of the present invention. The memory circuit 8 includes a first voltage supply circuit 10, and a second voltage supply circuit 14 for providing power to the memory array 20 on the same integrated circuit chip.

The memory array 20 has a plurality of memory cells 26 accessed by column lines 22 and row lines 24. The output of the first voltage supply circuit 10 is provided to a column decoder circuit 12. The column decoder circuit 12 contains the appropriate circuitry and input terminals for receiving the address and decoding the address for a particular column to be accessed within a memory array. Included within the column decoder circuit 12 is also the appropriate circuitry and connection for providing the correct voltage at the appropriate timing sequence on each of the respective column lines 22, the details of which are not shown because these are well known in the art. The voltage output of the first voltage supply circuit 10 is therefore provided, through the column decoder circuitry 12, to the column lines 22.

The row lines 24 are driven by the row decoder circuit 16. The row decoder circuit 16 contains the appropriate address input terminals and circuitry for properly addressing and putting the correct voltage supply on the proper row line 24. The second voltage supply circuit 14 is coupled to the row decoder 16 for providing the appropriate voltage level to be placed on the row lines 24 (the details of which are known in the art and therefore not shown).

A sensing circuit 18 has its input line 19 coupled to the output of the first voltage supply circuit 10. The sensing circuit 18 receives the output of the first voltage supply circuit at its input 19. The sensing circuit 18 provides at an output line 21 a signal which corresponds to the value of the input signal on input line 19. The signal on the output line 21 is received by the second voltage supply circuit 14 and is used to modify its output voltage level to the row decoder circuit 16. The sensing circuit 18 can be any acceptable sensing circuit for recognizing the output of the first voltage supply circuit 10. In one embodiment, it is a voltage sensing circuit which senses the value of the voltage and provides, on its output, a signal proportional to the value of the voltage which has been sensed. Alternatively, it may sense the current output of the first voltage supply circuit, or some other parameter which is indicative of the power being provided to the column lines 22. For those memories whose column lines are current driven rather than voltage driven, a current sensing circuit for circuit 18 would be more applicable while in other memories a voltage sensing circuit is preferred.

The output signal on line 21 may be of any acceptable type, for example, it may be a digital signal having the appropriate number of bits for providing the input to the second supply circuit 14. Alternatively, it may be an analogue voltage signal, current signal, or any other acceptable signal which provides an indication of the power being output by the first voltage supply circuit 10. One particular embodiment of the inventive circuit will be described in more detail with respect to FIG. 3B.

Figure 3B:
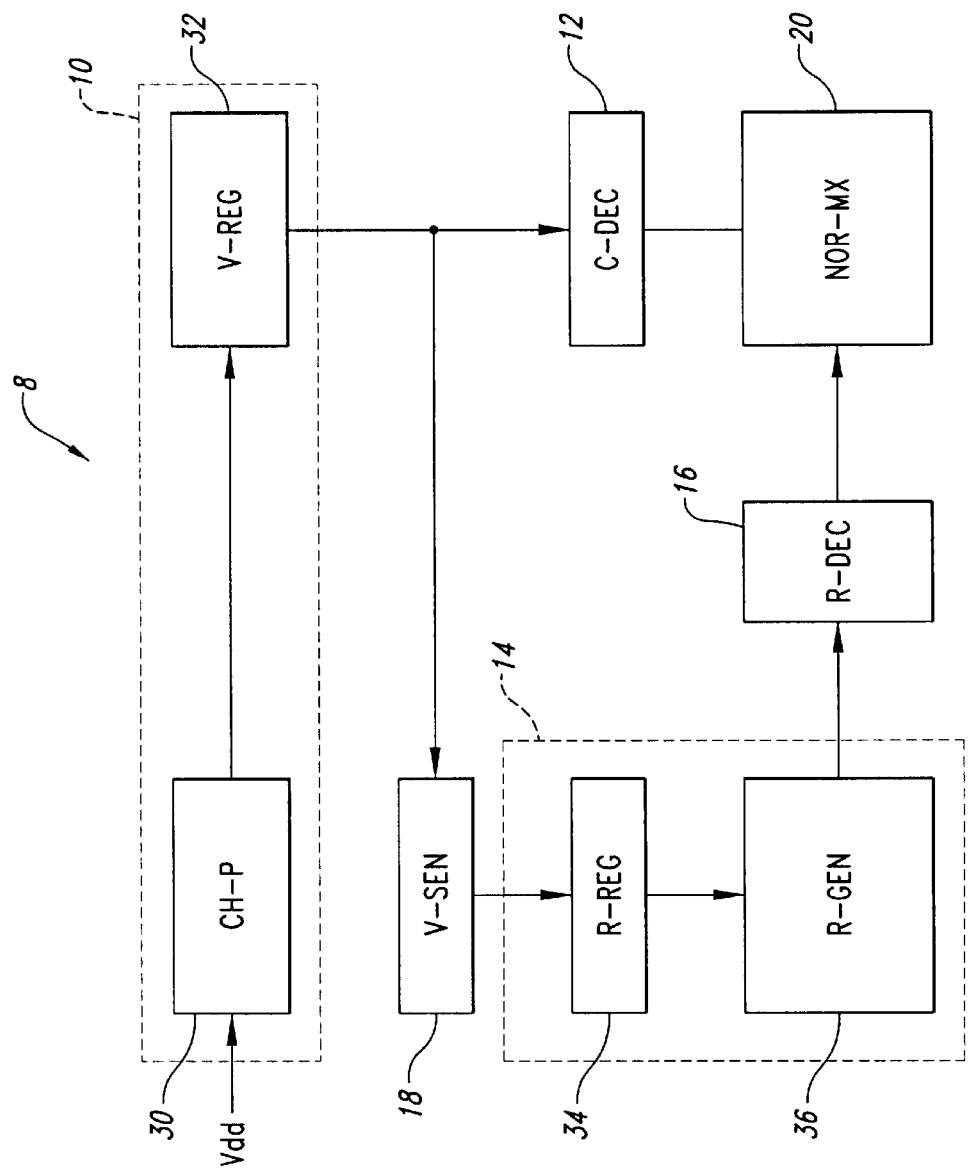
FIG. 3B is a more detailed block diagram of a circuit structure according to the present invention.

In FIG. 3B, the memory circuit 8 includes a block NOR-MX 20 that represents a matrix of flash EEPROM memory cells 26 having their respective gate electrodes connected to one another by row lines, and their respective drain electrodes connected to one another by column lines. The source electrodes of the cells are connected together to a common terminal, not shown. A column decoder C-DEC 12 contains controllable connection means, not shown, for example, transistors having the function of electronic switches, for connecting the column lines to a column polarizing voltage supply. All or some of the column lines or individual column lines can be selected for connection. The column supply is represented in the drawing by a charge pump CH-P 30 connected to a constant-voltage supply Vdd, and by a voltage regulator V-REG 32. A line decoder R-DEC contains controllable connection means, not shown, for connecting the row lines to a row polarizing voltage supply. It is also possible to select all or some of the row lines or individual row lines for connection. The row supply is represented by a ramp voltage generator R-GEN 36 with a regulator R-REG 34 for regulating the rate of voltage increase. A voltage sensor V-SEN 18 is connected to the voltage regulator V-REG 32 in order to monitor its output voltage and to supply a corresponding signal to the rate of increase regulator R-REG 34. A stepped voltage generator may be used instead of the ramp voltage generator.

When the memory is in operation, first of all, the actual erasure of the matrix NOR-MX or of a section thereof defined by a predetermined number of rows and by a predetermined number of columns is performed. For example, all of the cells are erased, that is, are brought to the "1" state as described above. In order to equalize the threshold voltages of the erased cells, according to the invention, all of the rows or a predetermined number of rows and all of the columns or a predetermined number of columns are selected and simultaneously connected to the respective supplies. For simplicity of description, it is assumed that all of the rows and all of the columns are selected and biased.

The output voltage of the ramp generator R-GEN 36, applied to the row lines at the beginning of the equalization treatment, is set at a predetermined minimum value at the design stage. This minimum voltage is selected so as to be below the minimum threshold voltage which can be expected for the erased cells and, in any case, low enough to ensure that the total current absorbed by the cells in these initial polarization conditions, that is, the sum of the leakage currents of the cells, is not such as to load the column supply beyond its capacity. In other words, it is ensured that the total current absorbed does not cause a decrease in the column biasing voltage below a predetermined value and, more precisely, that value required for correct biasing at the programming stage.

The maximum rate of variation of the row voltage, that is, the maximum slope of the ramp of the generator R-GEN 36, is also set at the design stage. In particular, it may be selected so as to be very high, for example, 1 V/$\mu$s, in view of the fact that the true rate of change is regulated continuously in order to be adapted to contingent requirements, as described below.

As the ramp voltage, and with it the gate voltage of the cells, gradually increases, the cells which have lower threshold voltages are subjected to the same process as is used in the programming stage, that is, their floating-gate electrodes are enriched with electrons so that their threshold voltages are increased. The number of cells with thresholds which are too low is thus gradually reduced, and the overall leakage current is also reduced therewith.

The sensing circuit V-SEN 18 detects the output voltage of the voltage regulator V-REG 32 and supplies a corresponding signal to the rate of increase regulator R-REG 34 which in turn determines the effective slope of the ramp voltage of the ramp generator R-GEN 36. The effect of the feedback loop is that the output voltage of the column supply is kept constant by varying the rate of increase of the row voltage based on the overall current-absorption of the cells.

Thus, the rate of increase of the row voltage may reach a maximum possible rate which is compatible with the current-output capacity of the charge pump.

The equalization process terminates when the ramp voltage reaches a maximum value which is set at the design stage. At this point, the threshold voltages of the cells will be distributed within a very narrow band of values disposed below the erase verify level.

The method according to the invention thus enables the row voltage to be adapted automatically to the capacity of the charge pump used for biasing the columns and, indirectly, to the threshold distribution of the cells after erasure. This enables devices to be designed with smaller charge pump dimensions and, thus, with considerable savings in area in comparison with the prior art. The method also at the same time ensures an increased speed of equalization of the threshold voltages of the cells. In this connection, it should also be noted that the minimum voltage of the ramp generated can be selected so as to be very low, in order to bring all of the cells within the predetermined range, without this appreciably affecting the equalization time. This contrasts with conventional methods in which the minimum starting voltage is one of the main parameters which affects the time taken to perform the operation.

If the maximum ramp voltage is selected so as to be fairly low to avoid the risk of any cell being programmed, that is, brought to zero logic value, the equalization process may require an additional, selective treatment. For example, conventional threshold regulation operations may be used, that is, the cells may be selected individually and suitable corrections may be applied to each of them, as explained at the beginning. In this case, however, there will be neither the problems of identifying the cells or of parasitic absorption in the column lines, nor the other problems described above with reference to the prior art, since the distribution of the threshold voltages is already sufficiently narrow.

Embodiments of the invention has been described and illustrated, clearly many modifications are possible within the scope of the same inventive concept. For example, instead of applying the method described to all of the cells of a matrix together, it could be applied to subsets of cells or to sections of the matrix in succession; in this case, the dimensions of the subsets could be selected automatically on the basis of the effective capacity of the column-polarization voltage supply.

Moreover, the invention may be used not only with a two-level flash EEPROM memory such as that described, but with any other memory that can be used in those types in which erasure takes place simultaneously for all the cells or for blocks of cells or other types as appropriate. It is also applicable, both for threshold equalization after erasure and for actual programming of the memory cells, to all memory in which the current required for the programming is controllable by means of the gate voltages of the cells.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of modifying the threshold voltages of a plurality of non-volatile memory cells, the method comprising:

connecting a predetermined number of column lines to a voltage supply;

monitoring the supply voltage; and applying, to a predetermined number of row lines, a voltage variable from a predetermined minimum value to a predetermined maximum value, the rate of change being regulated to a maximum possible value compatible with the maintenance of the supply voltage of the column lines at a substantially constant, predetermined value.

2. A method according to claim 1 wherein the memory cells are EEPROM cells.

3. A method according to claim 1 wherein the predetermined number of column lines and the predetermined number of row lines are the total number of column lines and the total number of row lines which connect the cells of the plurality of memory cells, respectively.

4. A method according to claim 3, further including equalizing the threshold voltages of the plurality of memory cells after an erasure operation.

5. A method according to claim 1, further comprising:

selecting the memory cells individually;

measuring the threshold voltages of the selected memory cells, the selected memory cells being biased in reading conditions; and applying programming voltages of increasing amplitude thereto until a threshold voltage of a predetermined value is reached.

6. A method according to claim 1 wherein the variable voltage is a ramp voltage.

7. A method according to claim 1 wherein the variable voltage is a stepped voltage.

8. A method according to claim 1 further including programming the cells of the plurality of non-volatile memory cells.

9. A method according to claim 8 wherein the predetermined number of row lines is 1 and wherein applying the voltage variable from the predetermined minimum value to the predetermined maximum value is performed for each row line containing a cell to be programmed.

10. A circuit structure comprising:

a plurality of non-volatile memory cells connected to one another by row lines and by column lines;

a first voltage supply for biasing the column lines;

a second voltage supply for biasing the row lines;

a first connection means for connecting the first voltage supply to the column lines;

a second connection means for connecting the second voltage supply to the row lines; and the second voltage supply being comprised of a generator of a voltage variable from a predetermined minimum value to a predetermined maximum value, a sensing circuit for detecting the output voltage of the first voltage supply, and a means for connecting the variable voltage generator and the sensing circuit to regulate the rate of variation of the voltage of the generator to a maximum value possible for keeping the output voltage of the first voltage supply substantially constant.

11. A circuit structure according to claim 10 wherein the memory cells are EEPROM cells.

12. A circuit structure according to claim 10 wherein the first voltage supply comprises a charge pump.

13. A circuit structure according to claim 10 wherein the second voltage supply is a ramp voltage generator.

14. A circuit structure according to claim 10 wherein the second voltage supply is a stepped voltage generator.

15. A circuit comprising:

a plurality of memory cells connected by row lines and by column lines;

a first voltage supply;

a second voltage supply;

a first connection means for connecting the first voltage supply to the column lines;

a second connection means for connecting the second voltage supply to the row lines; and a sensing circuit, wherein the sensing circuit is connected to an output of the first voltage supply and connected through a feedback path to an input of the second voltage supply.

16. A circuit according to claim 15 wherein the second voltage supply is a variable voltage generator.

17. A circuit according to claim 16 wherein a rate of change of an output voltage of the second voltage supply is dependent upon a signal received from the sensing circuit, which signal corresponds to an output voltage of the first voltage supply.

18. A circuit according to claim 16 wherein the second voltage supply comprises a ramp voltage generator.

19. A circuit according to claim 16 wherein the second voltage supply comprises a stepped voltage generator.

20. A circuit according to claim 15 wherein the first voltage supply comprises a charge pump.

21. A method for programming non-volatile memory devices comprising:

sensing a first voltage of a first supply coupled to a plurality of column lines; and controlling a maximum rate of change of a second voltage, from a predetermined minimum voltage to a predetermined maximum voltage, of a second supply coupled to a plurality of row lines while maintaining the first voltage of the first supply constant.

22. The method according to claim 21 further includes programming the memory cells.

23. The method according to claim 21 wherein the second voltage is a step voltage.

24. The method according to claim 21 wherein the second voltage is a ramp voltage.

25. The method according to claim 21 wherein sensing a decrease in the first voltage includes a decrease in the rate of change of the second voltage.

26. A method for modifying threshold voltages of non-volatile memory cells comprising:

supplying a first voltage from a first supply to a plurality of column;

supplying a second voltage, having a rate of change, from a second supply to a plurality of row lines;

providing a maximum rate of change of the second voltage; and altering the rate of change of the second voltage upon a change in the first voltage.

* * * * *